United States Patent
Kamada et al.

(10) Patent No.: US 8,367,280 B2
(45) Date of Patent: Feb. 5, 2013

(54) COLOR FILTER AND PHOTOMASK TO BE EMPLOYED FOR THE MANUFACTURE OF COLOR FILTER

(75) Inventors: Atsuko Kamada, Tokyo (JP); Ryuji Kawamoto, Tokyo (JP); Junichi Shiraishi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 1146 days.

(21) Appl. No.: 12/222,665

(22) Filed: Aug. 13, 2008

(65) Prior Publication Data

US 2009/0015957 A1   Jan. 15, 2009

Related U.S. Application Data

(63) Continuation of application No. PCT/JP2007/054457, filed on Mar. 7, 2007.

(30) Foreign Application Priority Data

Mar. 10, 2006   (JP) ................... 2006-065700

(51) Int. Cl.
G02B 5/20   (2006.01)
(52) U.S. Cl. ............................ 430/7; 430/321
(58) Field of Classification Search .......... None
See application file for complete search history.

(56) References Cited

U.S. PATENT DOCUMENTS

| 6,067,144 A * | 5/2000 | Murouchi ............ 349/156 |
| 2001/0026347 A1 | 10/2001 | Sawasaki et al. |
| 2002/0075443 A1 | 6/2002 | Shimizu et al. |
| 2003/0123018 A1 * | 7/2003 | Kim et al. .............. 349/155 |
| 2005/0140914 A1 | 6/2005 | Sawasaki et al. |

FOREIGN PATENT DOCUMENTS

| CN | 1363851 A | 8/2002 |
| CN | 1637528 A | 7/2005 |
| JP | 2001-201750 | 7/2001 |
| JP | 2002-23150 | 1/2002 |
| JP | 2002-182220 | 6/2002 |
| JP | 2002-189281 | 7/2002 |
| JP | 2003-121857 | 4/2003 |
| JP | 2005-189662 | 7/2005 |

OTHER PUBLICATIONS

English translation of the International Preliminary Report on Patentability mailed on Sep. 25, 2008 and issued in corresponding International Patent Application No. PCT/JP2007/054457.
Chinese Office Action mailed Aug. 14, 2009 and issued in corresponding Chinese Patent Application 2007800002062.
International Search Report mailed Apr. 17, 2007 in connection with the International application No. PCT/JP2007/054457.

* cited by examiner

Primary Examiner — John A. McPherson

(57) ABSTRACT

A color filter including a first photo-spacer, and a second photo-spacer having a smaller film thickness than that of the first photo-spacer, wherein the second photo-spacer has a cross-sectional configuration whose longitudinal width is made greater than the lateral width. These photo-spacers are formed by making use of a photomask which includes a first aperture pattern for forming the first photo-spacer, a second aperture pattern for forming the second photo-spacer which has a smaller film thickness than that of the first photo-spacer, wherein an aperture of the second aperture pattern has a lateral width in the range 2.0-10.0 μm and the ratio of lateral width to longitudinal width is confined to 11.25 or more.

14 Claims, 3 Drawing Sheets

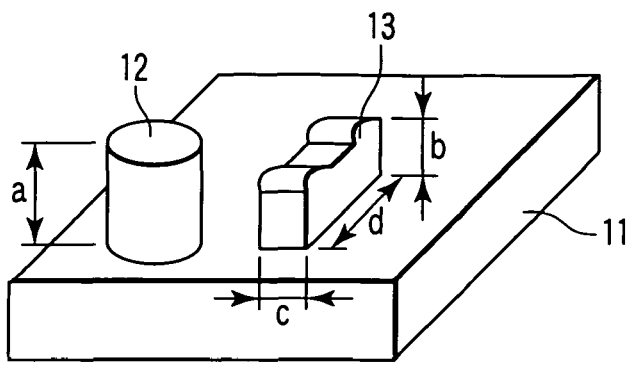
F I G. 1
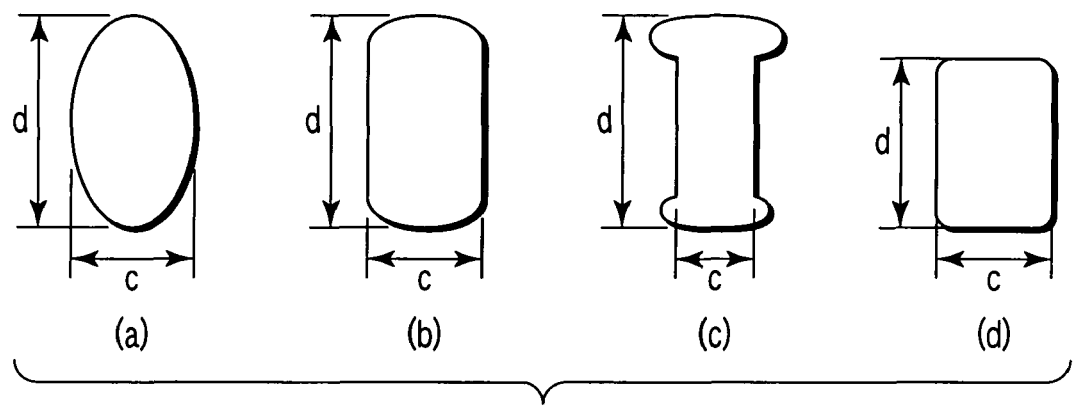
F I G. 2
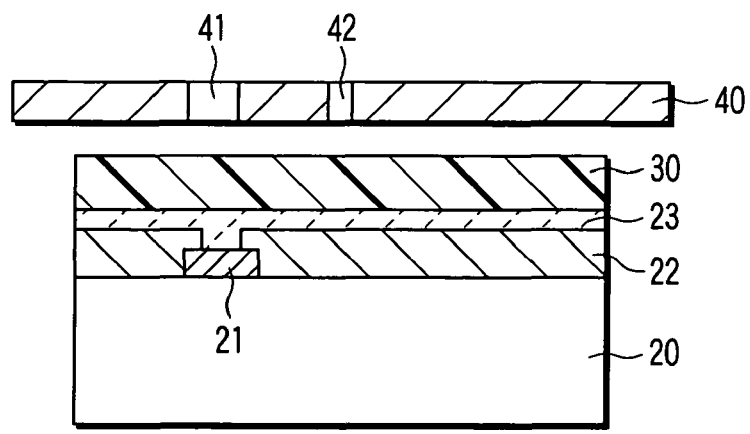
F I G. 3

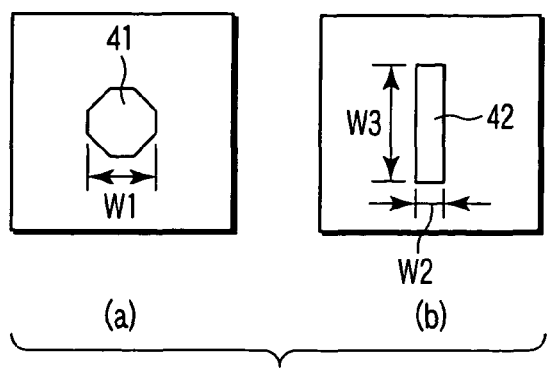
F I G. 4
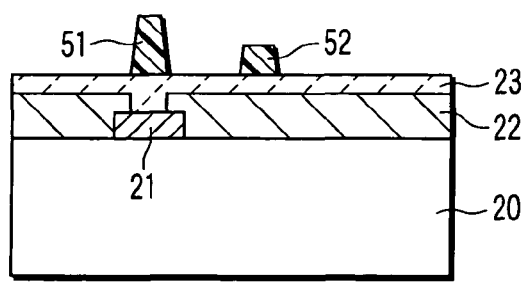
F I G. 5
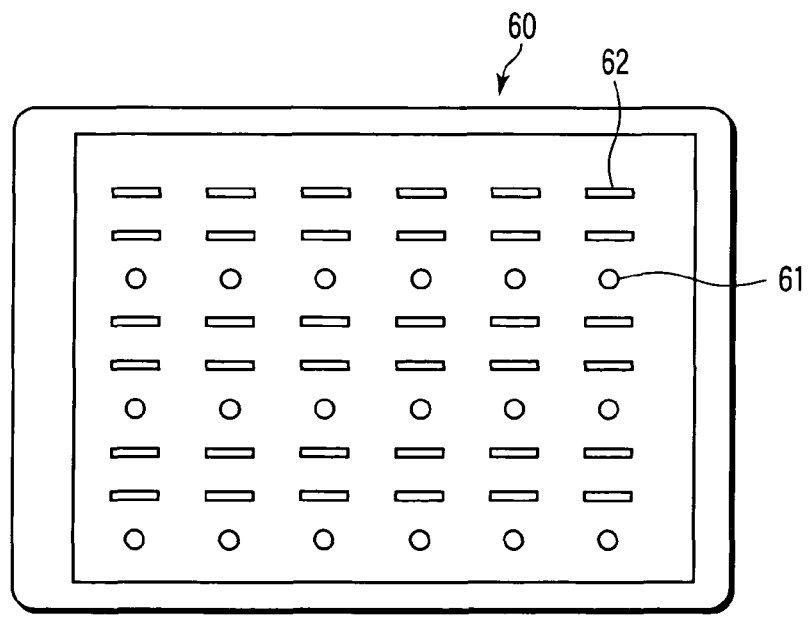
F I G. 6

US 8,367,280 B2

COLOR FILTER AND PHOTOMASK TO BE EMPLOYED FOR THE MANUFACTURE OF COLOR FILTER

CROSS REFERENCE TO RELATED APPLICATIONS

This is a Continuation application of PCT Application No. PCT/JP2007/054457, filed Mar. 7, 2007, which was published under PCT Article 21(2) in Japanese.

This application is based upon and claims the benefit of priority from prior Japanese Patent Application No. 2006-065700, filed Mar. 10, 2006, the entire contents of which are incorporated herein by reference.

BACKGROUND OF THE INVENTION

1. Field of the Invention

This invention relates to a color filter for a liquid crystal display device and to a photomask to be employed for the manufacture of the color filter. In particular, this invention relates to a color filter for a liquid crystal display device wherein two kinds of photo-spacers differing in thickness are employed.

2. Description of the Related Art

As shown in FIG. 7 for example, the color filter to be employed in a liquid crystal display device is constituted by a black matrix 71, a color pixel 72 and a transparent conductive film 73, all of which being successively deposited on a glass substrate 70. The color filter constructed in this manner can be manufactured as follows. First of all, the black matrix is formed on the glass substrate, then the color pixel is formed in alignment with a pattern of the black matrix, and the transparent conductive film is formed on the color pixel.

Due to the development and practical use of various kinds of liquid crystal display devices, there is an increasing trend to provide the color filter with various supplementary components having various kinds of functions depending on the application and specification of color filter, such supplementary components including, for example, 1) a protective layer (overcoat layer); 2) a transparent portion in the color filter to be employed in a translucent liquid crystal display device; 3) an optical path difference-adjusting layer for making uniform the phase of light passing through a permeative display region and a reflective display region; 4) a light-scattering layer for the reflective display region of color filter; 5) a photo-spacer (protruded portion) having spacer function; 6) an alignment-controlling protrusion for controlling the alignment of liquid crystal molecules; etc.

Especially, in the case of conventional liquid crystal display device, so-called spacer which is formed of transparent spherical particles (beads) or short fiber each made of glass or synthetic resin has been used for forming a gap between substrates.

However, since this spacer is formed of transparent particles, light is permitted to leak out through the spacer on the occasion of displaying black color if the spacer is permitted to enter, together with the liquid crystal, into the pixel. Further, due to the presence of the spacer between the substrates with a liquid crystal material being sealed therebetween, the alignment of liquid crystal molecules in the vicinity of the spacer is disturbed to generate the leakage of light at this portion, resulting in the decrease of contrast, thus raising various problems including adverse influences to the quality of display.

With a view to overcome these problems, there has been developed a technique wherein protrusions exhibiting the spacer function (hereinafter referred to as photo-spacers) are formed on the region of black matrix existing between pixels by means of photolithography method and by making use of a photosensitive resin.

FIG. 8 is a partial sectional view of such a color filter for liquid crystal display device. As shown in FIG. 8, a black matrix 81, a color pixel 82 and a transparent conductive film 83 are successively formed on the surface of glass substrate 80, and a photo-spacer 84 having the spacer function is formed as a protrusion on the regions of the transparent conductive film 83 below which the black matrix 81 is located, thus constituting the color filter 87 for liquid crystal display device. In the case of the liquid crystal display device where the color filter 87 constructed in this manner is employed, since the photo-spacer 84 is formed at the regions of transparent conductive film 83 where the color pixel is substantially not located, it is possible to improve the liquid crystal display device with respect to the improvement of contrast of liquid crystal display.

In the assembling step for creating a liquid crystal display panel through the lamination of the substrate with the color filter for liquid crystal display device, a seal portion (not shown) is formed at first on a peripheral portion of the substrate and of the color filter and then the assembly comprising the substrate and the color filter is placed between an upper platen and a lower platen. Thereafter, a load is applied to the assembly sandwiched between these upper and lower platens to thereby contact-bonding these seal portion and photo-spacer 84. On this occasion, due to the load applied to the assembly, the photo-spacer is elastically deformed more or less and, under the condition where the photo-spacer is deformed in this manner, the setting of gap between substrates is performed.

Even though the gap between the substrates is set in this manner by making use of the photo-spacer, it is desirable to minimize the deformation of the photo-spacer as an ordinary degree of load is applied to the panel and to prevent the plastic deformation and fracture of photo-spacer that may be caused to occur when an excessive load is applied to the panel.

As for the countermeasure to cope with the problems of the plastic deformation and fracture of photo-spacer due to an excessive load, there has been proposed a color filter for a liquid crystal display device wherein two kinds of photo-spacers are provided therein. FIG. 9 is a cross-sectional view schematically illustrating one example of such a color filter for a liquid crystal display device that is provided with two kinds of photo-spacers differing in height. As shown in FIG. 9, this color filter for a liquid crystal display device differs from the color filter constructed as shown in FIG. 8 in the respect that the photo-spacer is constituted by two kinds of photo-spacers, i.e., a main photo-spacer 84a which is relatively large in height and a subphoto-spacer 84b which is relatively small in height.

Among these two kinds of photo-spacers, the main photo-spacer 84a is utilized for setting the gap between the substrates. This main photo-spacer 84a is designed such that it is enabled to deform as a load is applied to the panel and that the configuration thereof is enabled to restore as the load is removed. Further, this main photo-spacer 84a is made elastic such that it can be deformed in conformity with the thermal expansion or thermal shrinkage of the liquid crystal that may be caused to occur due to changes of temperature.

The subphoto-spacer 84b is a photo-spacer which is lower in height than the main photo-spacer 84a. This subphoto-spacer 84b is designed such that when an excessive load is applied to the panel, this subphoto-spacer 84b acts to disperse this excessive load, thereby preventing the plastic deformation and fracture of the main photo-spacer 84a.

As for the method of forming the main photo-spacer and the subphoto-spacer which differ from one another, it is possible to employ a method to form a photo-spacer having a lower height, wherein a photomask having the same configuration as that of the main photo-spacer but having a smaller aperture than that of the main photo-spacer to thereby control the quantity of light transmittance (see for example, JP-A 2002-189281.

However, according to this method, since the subphoto-spacer is formed by making use of a photomask having a smaller aperture for reducing the quantity of light to be transmitted, the size of subphoto-spacer 84b is inevitably caused to become smaller not only in height but also in diameter as compared with those of the main photo-spacer 84a. If the diameter of subphoto-spacer 84b is small, the press resistance thereof would be inevitably lowered. Therefore, if it is desired to enhance the press resistance of subphoto-spacer 84b, the density of subphoto-spacer (the number of photo-spacer per unit area) is required to be increased. There is however limitations in increasing the density of photo-spacer. Further, since the subphoto-spacer which is small in diameter is vulnerable to peeling in the manufacturing process thereof, it is very difficult to create it unless the production conditions are strictly controlled.

There is also known a method of forming two kinds of photo-spacers differing in height from one another, wherein the subphoto-spacer is created through the control of transmittance of exposure light by applying half tone working as well as gray tone working to a photomask. This method however requires high precision in the working of the photomask, which is rather complicated.

BRIEF SUMMARY OF THE INVENTION

An object of the present invention is to provide a color filter exhibiting excellent press resistance, wherein two kinds of photo-spacers differing height are enabled to be formed in a single exposure treatment using the same mask, and another object of the present invention is to provide a photomask to be employed in the manufacture of such a color filter.

According to a first aspect of the present invention, there is provided a color filter comprising a first photo-spacer; and a second photo-spacer having a smaller film thickness than that of the first photo-spacer; wherein the second photo-spacer has a cross-sectional configuration whose longitudinal width is made greater than the lateral width.

According to a second aspect of the present invention, there is provided a photomask for creating photo-spacers for color filter, the photomask comprising a first aperture pattern for forming a first photo-spacer; a second aperture pattern for forming a second photo-spacer which has a smaller film thickness than that of the first photo-spacer; wherein the second aperture pattern has a lateral width in the range 2.0-10.0 μm and the ratio of lateral width to longitudinal width is confined to 1:1.25 or more.

According to a third aspect of the present invention, there is provided a color filter comprising a first photo-spacer; and a second photo-spacer having a smaller film thickness than that of the first photo-spacer; wherein the second photo-spacer has a cross-sectional configuration whose longitudinal width is made greater than the lateral width, and the first photo-spacer and the second photo-spacer are formed by subjecting a photosensitive composition to a single exposure and to a single developing operation by making use of the aforementioned photomask.

BRIEF DESCRIPTION OF THE SEVERAL VIEWS OF THE DRAWING

FIG. 1 is a perspective view illustrating one example of the photo-spacer according to one embodiment of the color filter of the present invention;

FIG. 2 shows diagrams illustrating various examples of the horizontal cross-sectional configuration of the subphoto-spacer;

FIG. 3 is a cross-sectional view for illustrating the method of exposure for forming the main photo-spacer and the subphoto-spacer;

FIG. 4 is an enlarged plan view illustrating the shape of apertures corresponding respectively to the main photo-spacer and subphoto-spacer of photomask;

FIG. 5 is a cross-sectional view showing a color filter provided with main photo-spacers and subphoto-spacers which are formed by way of the exposure method shown in FIG. 3;

FIG. 6 is a plan view for showing one example of a color filter having main photo-spacers and subphoto-spacers arranged therein;

DETAILED DESCRIPTION OF THE INVENTION

Figure 7:
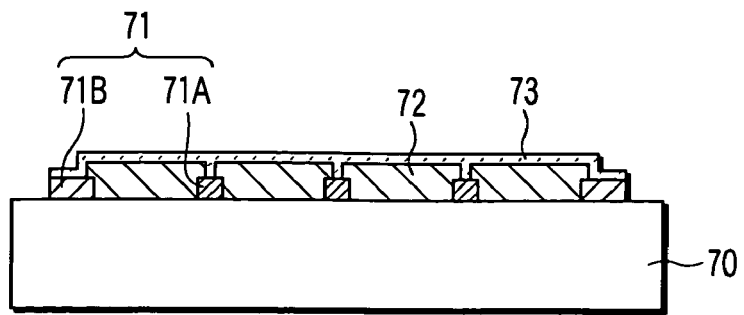
FIG. 7 is a cross-sectional view showing the conventional color filter.
Figure 8:
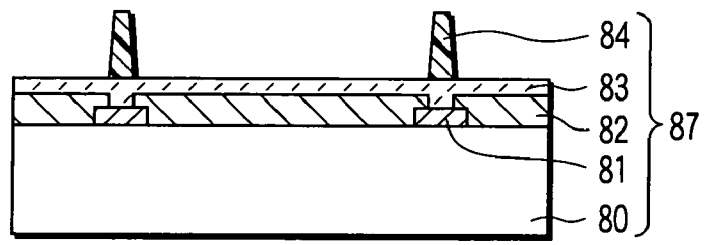
FIG. 8 is a cross-sectional view showing the conventional color filter having photo-spacers.
Figure 9:
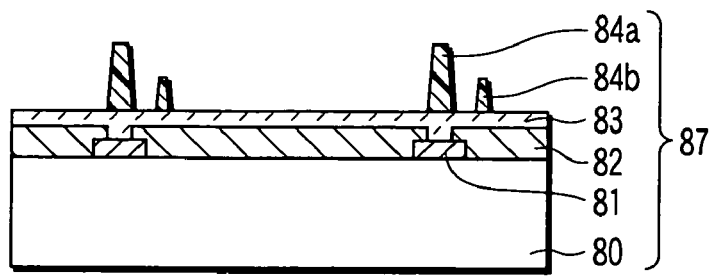
FIG. 9 is a cross-sectional view showing the conventional color filter having two kinds of photo-spacers differing in film thickness from one another.

Next, the best mode for carrying out the invention will be explained.

The color filter according to one aspect of the present invention is featured in that it comprises a first photo-spacer; and a second photo-spacer having a smaller film thickness than that of the first photo-spacer; wherein the second photo-spacer has a cross-sectional configuration whose longitudinal width is made greater than the lateral width.

In this color filter, the second photo-spacer may preferably be formed to have a cross-sectional configuration wherein the longitudinal width thereof is at least 1.25 times greater than the lateral width thereof. Further, the second photo-spacer may preferably be formed to have a cross-sectional configuration selected from the group consisting of rectangular shape, elliptical shape, oval shape and bobbin-like shape.

Additionally, the second photo-spacer may be formed to have an upper surface which is configured such that the opposite side portions thereof are protruded in the longitudinal direction to provide two protruded portions.

Further, a difference in thickness between the first photo-spacer and the second photo-spacer may preferable be confined to the range 0.1-1.0 μm. Additionally, the second photo-spacer is arranged at a region over the black matrix.

The photomask according to another aspect of the present invention is featured in that it comprises a first aperture pattern for forming a first photo-spacer; a second aperture pattern for forming a second photo-spacer which has a smaller film thickness than that of the first photo-spacer; wherein the second aperture pattern has a lateral width in the range 2.0-10.0 μm and the ratio of lateral width to longitudinal width is confined to 1:1.25 or more.

In this photomask, preferably, the first aperture pattern is circular having a diameter which is greater than the length of the lateral width of the second aperture pattern. Further, the second aperture pattern has a lateral width which is preferably confined to the range 3.0-5.0 µm. Furthermore, the first aperture pattern has a width which is preferably confined to the range 8-20 µm.

FIG. 1 shows a perspective view schematically illustrating one example of the local arrangement of photo-spacer according to one embodiment of the present invention. Referring to FIG. 1, a first photo-spacer (main photo-spacer) 12 having a height "a", and a second photo-spacer (subphoto-spacer) 13 having a height "b" which is lower in height than that of the main photo-spacer 12 are arranged side by side on the surface of substrate (for example, transparent conductive film) 11.

With respect to the cross-sectional configuration of any of these photo-spacers, the ratio between the lateral width (shorter diameter) thereof and the longitudinal width (longer diameter) thereof, i.e., the ratio of lateral width to longitudinal width, may preferably be confined to the range 1:1.25 or more. If the longitudinal width is less than this range, the area of the second photo-spacer, as it is looked from above, would become insufficient, more likely resulting in undesirable decline in press resistance of the second photo-spacer.

In this embodiment, while the main photo-spacer 12 is cylindrical in configuration, the subphoto-spacer 13 is formed of a rectangular parallelepiped, the top surface of which is accompanied, on the opposite sides, with two protruded portions. In other words, the subphoto-spacer 13 is substantially rectangular in vertical cross-sectional configuration with the protruded portions being formed at the opposite upper edge portions thereof. By "vertical cross-sectional configuration", it is intended to mean a cross-sectional configuration to be obtained as the substrate 11 is vertically cut.

Incidentally, as for the horizontal cross-sectional configuration of the subphoto-spacer 13, there is not any specific limitation as long as it is substantially rectangular. For example, the horizontal cross-sectional configuration of the subphoto-spacer 13 may be, as shown in FIG. 2, (a) elliptical, (b) oval, (c) bobbin-like or (d) substantially rectangular.

Further, a difference in thickness between the main photo-spacer 12 and the subphoto-spacer 13 may preferable be confined to the range 0.1-1.0 µm. If this difference in film thickness is less than 0.1 µm, the low-temperature resistance of LCD panel would be degraded. On the other hand, if this difference in film thickness is greater than 1.0 µm, it may become difficult to improve the press resistance characteristics of LCD panel.

Herein, one example of the exposure conditions for the photo-spacer that can be employed in one embodiment of the present invention will be described.

Exposure system: Proximity Exposure
Gap (G) for proximity exposure: 150±50 µm
Dosage of exposure: 100-200 mJ/cm$^2$
Exposure wavelength: 365 nm
Resin composition: Negative type photosensitive resin composition In order to create the main photo-spacer 12 as described above, it is preferable to confine the aperture width W1, shown in FIG. 4(a), of the photomask pattern for creating the main photo-spacer to the range 8-20 µm. The reason for this is that, in the case of the octagonal aperture pattern as shown in FIG. 4(a), if this width W1 is less than 8 µm, the transmission intensity of exposure light would become too small to enable the exposure to increase up to the saturation sensitivity of photosensitive resin composition, thereby making it difficult to perform the patterning of the photomask.

In order to form the subphoto-spacer 13 which is smaller in film thickness than that of the main photo-spacer 12 to be formed as described above by a magnitude of 0.1-1.0 µm, it is necessary to confine the lateral width W2 of the subphoto-spacer-forming photomask pattern shown in FIG. 4(b) to the range 2.0-10.0 µm to thereby create the subphoto-spacer 13 wherein the ratio (lateral width W2):(longitudinal width W3) is confined to 1:1.25 or more. Especially, it is more preferable that the lateral width W2 is confined to the range 3.0-5.0 µm.

If the lateral width W2 is less than 2.0 µm, the transmission intensity of exposure light would become too small to enable the exposure to increase up to the saturation sensitivity of photosensitive resin composition, thereby making it difficult to perform the patterning of the photomask. Further, if the ratio (lateral width W2):(longitudinal width W3) is less than 1:1.25, the light passing through the photomask during the exposure is caused to converge at one point, resulting in increase of the transmission intensity of exposure light, thus making it impossible to reduce the film thickness. Whereas, when the lateral width W2 is confined to the range 3.0-5.0 µm and, at the same time, the ratio (lateral width W2):(longitudinal width W3) is regulated to 1:1.25 or more, the light passing through the photomask during the exposure can be divided into two parts, resulting in decrease of the transmission intensity of exposure light, thus making it possible to create the subphoto-spacer having a reduced film thickness.

The aforementioned difference in film thickness between the main photo-spacer 12 and the subphoto-spacer 13 can be created by making the aperture width of photomask for forming the subphoto-spacer 13 less than the aperture width of photomask for forming the main photo-spacer 12 to thereby reduce the quantity of light passing therethrough. However, when the aperture width is simply reduced, the size of horizontal cross-sectional area of the subphoto-spacer 13 to be obtained would become smaller, resulting in degradation of press resistance of the subphoto-spacer 13.

It has been found out by the present inventors that when the aperture of photomask for forming the subphoto-spacer 13 is configured so as to make it narrower in lateral direction and make it longer in longitudinal direction, the converged portion of light can be divided into two parts to thereby make it possible to disperse the light and to control the transmission intensity of exposure light, and that when exposure and development of a photosensitive resin composition are performed by making use of this specific aperture, it is possible to obtain the subphoto-spacer 13 having a reduced film thickness and a cross-sectional area which is the same as or greater than that of the main photo-spacer.

Next, examples of the present invention and comparative examples will be described to specifically explain the present invention.

Example 1

A method of manufacturing a color filter provided with main photo-spacers 12, 51 and subphoto-spacers 13, 52 as shown in FIGS. 1 and 5 will be explained with reference to FIG. 3.

As shown in FIG. 3, a photoresist layer 30 is formed on the surface of a glass substrate 20 having a black matrix 21, a color pixel 22 and a transparent conductive film 23 deposited successively thereon. Over this photoresist layer 30, there is disposed a photomask 40 for creating photo-spacers for color filter with a gap (G) for proximity exposure being interposed therebetween.

This photomask 40 is provided with apertures 41 and 42 corresponding to the main photo-spacer and the subphoto-spacer, respectively. One example of the configuration of aperture 41 is shown in FIG. 4(a) and one example of the configuration of aperture 42 is shown in FIG. 4(b). As shown in FIG. 4(a), the configuration of aperture 41 is octagonal and as shown in FIG. 4(b), the configuration of aperture 42 is rectangular.

The face of the photomask 40 is directed to face the surface of photoresist layer 30. The photoresist layer 30 employed in this example was a negative type photosensitive resin (NN777 (trade name; JSR Co., Ltd.)).

The width W1 of the aperture 41 of photomask 40 for forming the main photo-spacer was set to 10 μm. On the other hand, the aperture 42 of photomask 40 for forming the subphoto-spacer whose height should be lower than that of the main photo-spacer was set to 3.0 μm in lateral width W2 and 20 μm in longitudinal width W3. The reason for creating the aperture 42 in this manner is that by making the width of pattern (aperture) narrow in this way, the area of light convergence is dispersed to two regions, thereby making it possible to reduce the transmission intensity of exposure light and to form a photo-spacer which is relatively low in height.

The exposure of the photoresist layer 30 through this photomask 40 was performed by way of the proximity exposure under the following conditions.

Gap (G) for proximity exposure: 150±50 μm
Dosage of exposure: 100-200 mJ/cm$^2$
Exposure wavelength: 365 nm The photoresist layer 30 which had been subjected to the exposure under the aforementioned conditions was subsequently subjected to development using an alkaline aqueous solution to create a main photo-spacer 51 and a subphoto-spacer 52 on the surface of transparent conductive film formed on a black matrix as shown in FIG. 5.

In this case, since the Gap (G) for proximity exposure was sufficiently secured at the aperture 41 having a width W1 for forming the main photo-spacer, the light irradiated was turned to have approximately circular configuration on the surface of photomask 40 due to the diffraction of light at the edge of aperture, resulting in the creation of the main photo-spacer 51 having a circular cross-section.

On the other hand, in the case of the aperture 42 having a lateral width W2 and a longitudinal width W3 for forming the subphoto-spacer, since the light being irradiated was converged at four corners of rectangular configuration and divided into two parts, the transmission intensity thereof was caused to decrease, thereby creating the subphoto-spacer 52 having a relatively low height. The configuration of the subphoto-spacer 52 was formed of a rectangular parallelepiped, the top surface of which was accompanied, on the opposite sides, with two protruded portions as shown in FIG. 1.

The height of the main photo-spacer 51 thus created was 4.65 μm the height of the subphoto-spacer 52 thus created was 4.12 μm, thus giving a difference in height of 0.53 μm between the main photo-spacer 51 and the subphoto-spacer 52.

Example 2

Photo-spacers were created in the same manner as described in Example 1 by making use of a photomask wherein the width W1 of the aperture 41 for forming the main photo-spacer was set to 15 μm and the aperture 42 for forming the subphoto-spacer was set to 8.0 μm in lateral width W2 and 10 μm in longitudinal width W3 (i.e., lateral width W2:longitudinal width W3=1:1.25). The height "a" of the main photo-spacer 51 thus created was 4.60 μm and the height "b" of the subphoto-spacer 52 thus created was 4.12 μm, thus giving a difference in height of 0.48 μm between the main photo-spacer 51 and the subphoto-spacer 52.

Example 3

Photo-spacers were created in the same manner as described in Example 1 by making use of a photomask wherein the width W1 of the aperture 41 for forming the main photo-spacer was set to 10 μm and the aperture 42 for forming the subphoto-spacer was set to 5.0 μm in lateral width W2 and 15.0 μm in longitudinal width W3 (i.e., lateral width W2:longitudinal width W3=1:1.3). The height "a" of the main photo-spacer 51 thus created was 4.654 μm and the height "b" of the subphoto-spacer 52 thus created was 4.496 μm, thus giving a difference in height of 0.16 μm between the main photo-spacer 51 and the subphoto-spacer 52.

Example 4

Photo-spacers were created in the same manner as described in Example 1 by making use of a photomask wherein the width W1 of the aperture 41 for forming the main photo-spacer was set to 10 μm and the aperture 42 for forming the subphoto-spacer was set to 2.5 μm in lateral width W2 and 20.0 μm in longitudinal width W3 (i.e., lateral width W2:longitudinal width W3=1:8). The height "a" of the main photo-spacer 51 thus created was 4.65 μm and the height "b" of the subphoto-spacer 52 thus created was 3.72 μm, thus giving a difference in height of 0.93 μm between the main photo-spacer 51 and the subphoto-spacer 52.

Comparative Example 1

It was tried to create photo-spacers in the same manner as described in Example 1 by making use of a photomask wherein the width W1 of the aperture 41 for forming the main photo-spacer was set to 10 μm and the aperture 42 for forming the subphoto-spacer was set to 1.0 μm in lateral width W2 and 20.0 μm in longitudinal width W3 (i.e., lateral width W2:longitudinal width W3=1:1.20). As a result, although it was possible to create the main photo-spacer, it was impossible to create the subphoto-spacer because of the peeling of the subphoto-spacer during the developing operation thereof.

The reason for this phenomenon may be attributed to the fact that since the value of W2 of subphoto-spacer was too small to secure a sufficient transmission of light passing through the mask, so that it was impossible to obtain a sufficient dosage of exposure for the creation of the subphoto-spacer, resulting in the peeling of the subphoto-spacer during the developing operation thereof.

Comparative Example 2

Photo-spacers were created in the same manner as described in Example 1 by making use of a photomask wherein the width W1 of the aperture 41 for forming the main photo-spacer was set to 10 μm and the aperture 42 for forming the subphoto-spacer was set to 8.7 μm in lateral width W2 and 10.0 μm in longitudinal width W3 (i.e., lateral width W2:longitudinal width W3=1:1.15).

The height "a" of the main photo-spacer thus created was 4.65 μm and the height "b" of the subphoto-spacer thus created was 4.60 μm, thus giving a difference in height of 0.05 μm between the main photo-spacer and the subphoto-spacer, thus failing to obtain a value as required.

The results of Examples 1-4 and Comparative Examples 1 and 2 described above are summarized in the following Table 1.

TABLE 1

| | Longitudinal/lateral ratio as W2 was set to 1 | | Main | Aperture of subspacer mask | | Main | Sub | Difference in thickness of |
|---|---|---|---|---|---|---|---|---|
| | Lateral W2 | Longitudinal W3 | Width W1 | Width W2 | Width W3 | (thickness) | (thickness) | Main-Sub |
| Ex. 1 | 1.00 | 6.70 | 10 | 3.0 | 20 | 4.65 | 4.12 | 0.53 |
| Ex. 2 | 1.00 | 1.25 | 15 | 8.0 | 10 | 4.60 | 4.50 | 0.10 |
| Ex. 3 | 1.00 | 3.00 | 10 | 5.0 | 15 | 4.65 | 4.50 | 0.16 |
| Ex. 4 | 1.00 | 8.00 | 10 | 2.5 | 20 | 4.65 | 3.73 | 0.93 |
| Comp. Ex. 1 | 1.00 | 20.00 | 10 | 1.0 | 20 | Peeled (impossible to form photo-spacer) | | |
| Comp. Ex. 2 | 1.00 | 1.15 | 10 | 8.7 | 10 | 4.65 | 4.60 | 0.05 |

In the embodiments and examples explained above, the main photo-spacer 51 is positioned above the black matrix 21. However, it would be more advantageous to place the long and slender subphoto-spacer 52 above the black matrix 21 in preventing the degradation of contrast that may be caused due to the presence of photo-spacer.

FIG. 6 illustrates one example of color filter wherein the main photo-spacer and the subphoto-spacer are arranged. As shown in FIG. 6, in the case of this color filter 60, the main photo-spacers having a circular cross-section and the subphoto-spacers 62 having a long and slender rectangular cross-section are regularly arranged.

As described above, according to the embodiments of the present invention, it is possible to create the subphoto-spacer which is lower in height than that of the main photo-spacer in the same step for creating the main photo-spacer with the employment of a single photomask and a single exposure operation. Namely, this can be realized by designing the aperture of photomask for creating the subphoto-spacer such that the lateral width thereof is made less than the longitudinal width thereof.

Further, by elongating the longitudinal width of the photomask for creating the subphoto-spacer, it is possible to create the subphoto-spacer having a cross-sectional area which is almost the same as or greater than that of the main photo-spacer in a single exposure operation using a single photomask.

Thus, since it is possible to create a subphoto-spacer having a large cross-sectional area, it is now possible to provide a color filter having a high press resistance. Further, since it is possible to create a subphoto-spacer having a large cross-sectional area, the control of production conditions of the color filter can be simplified, thus making it possible to enhance the productivity.

Incidentally, the configuration of the pattern of aperture of the photomask to be used for forming the subphoto-spacer may be simply rectangular without necessitating the half-tone working. Therefore, the working of the photomask can be simplified, thus making it possible to perform the patterning with high productivity.

What is claimed is:

1. A color filter comprising:
a first photo-spacer; and
a second photo-spacer having a smaller thickness than that of the first photo-spacer;
wherein the first photo-spacer has a cross-sectional configuration whose longitudinal width is the same as the lateral width, and the second photo-spacer has a cross-sectional configuration whose longitudinal width is made greater than the lateral width.

2. The color filter according to claim 1, wherein the second photo-spacer has a cross-sectional configuration whose longitudinal width is at least 1.25 times greater than the lateral width.

3. The color filter according to claim 2, wherein the second photo-spacer is formed to have a cross-sectional configuration selected from the group consisting of rectangular shape, elliptical shape, oval shape and bobbin-like shape.

4. The color filter according to claim 2, herein the second photo-spacer has an upper surface which is configured such that the opposite side portions thereof are protruded in the longitudinal direction to provide two protruded portions.

5. The color filter according to claim 2, wherein a difference in thickness between the first photo-spacer and the second photo-spacer is confined to the range of 0.1 to 1.0 µm.

6. The color filter according to claim 2, wherein the second photo-spacer is arranged at a region over a black matrix.

7. The color filter according to claim 1, wherein the second photo-spacer is formed to have a cross-sectional configuration selected from the group consisting of rectangular shape, elliptical shape, oval shape and bobbin-like shape.

8. The color filter according to claim 7, herein the second photo-spacer has an upper surface which is configured such that the opposite side portions thereof are protruded in the longitudinal direction to provide two protruded portions.

9. The color filter according to claim 7, wherein a difference in thickness between the first photo-spacer and the second photo-spacer is confined to the range of 0.1 to 1.0 µm.

10. The color filter according to claim 7, wherein the second photo-spacer is arranged at a region over a black matrix.

11. The color filter according to claim 1, herein the second photo-spacer has an upper surface which is configured such that the opposite side portions thereof are protruded in the longitudinal direction to provide two protruded portions.

12. The color filter according to claim 1, wherein a difference in thickness between the first photo-spacer and the second photo-spacer is confined to the range of 0.1 to 1.0 µm.

13. The color filter according to claim 1, wherein the second photo-spacer is arranged at a region over a black matrix.

14. A color filter comprising:
a first photo-spacer; and
a second photo-spacer having a smaller film thickness than that of the first photo-spacer;
wherein the first photo-spacer has a cross-sectional configuration whose longitudinal width is the same as the lateral width, and the second photo-spacer has a cross-sectional configuration whose longitudinal width is made greater than the lateral width, and
the first photo-spacer and the second photo-spacer are formed by subjecting a photosensitive composition to a single exposure and to a single developing operation by making use of a photomask comprising:
a first aperture pattern for forming a first photo-spacer; and
a second aperture pattern for forming a second photo-spacer which has a smaller film thickness than that of the first photo-spacer,
wherein an aperture of the second aperture pattern has a lateral width ranging from 2.0 to 10.0 µm, and a ratio of lateral width to longitudinal width is 1:1.25 or more.

* * * * *